(12) United States Patent
Im et al.

(10) Patent No.: US 7,924,646 B2
(45) Date of Patent: *Apr. 12, 2011

(54) FUSE MONITORING CIRCUIT FOR SEMICONDUCTOR MEMORY DEVICE

(75) Inventors: Jae-Hyuk Im, Gyeonggi-do (KR); Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 158 days.

This patent is subject to a terminal disclaimer.

(21) Appl. No.: 12/344,379

(22) Filed: Dec. 26, 2008

(65) Prior Publication Data

US 2009/0168581 A1    Jul. 2, 2009

(30) Foreign Application Priority Data

Dec. 27, 2007    (KR) ........................ 10-2007-0139011

(51) Int. Cl.
*G11C 17/18* (2006.01)
(52) U.S. Cl. ............ 365/225.7; 365/189.06; 365/189.08
(58) Field of Classification Search ............... 365/225.7, 365/189.06, 189.08, 191, 200, 201
See application file for complete search history.

(56) References Cited

U.S. PATENT DOCUMENTS

| | | | |
|---|---|---|---|
| 5,422,851 A | 6/1995 | Ozeki | |
| 5,935,253 A | 8/1999 | Conary et al. | |
| 6,108,261 A * | 8/2000 | Kim et al. ................... | 365/225.7 |
| 6,226,211 B1 | 5/2001 | Kwak et al. | |
| 6,640,198 B2 | 10/2003 | Miyazaki et al. | |
| 6,757,857 B2 | 6/2004 | Lamb et al. | |
| 6,834,016 B2 * | 12/2004 | Kato et al. ...................... | 365/200 |
| 7,054,207 B2 * | 5/2006 | Keeth et al. ................... | 365/200 |
| 7,317,645 B2 * | 1/2008 | Kim et al. ...................... | 365/200 |
| 2004/0051553 A1 | 3/2004 | Manna et al. | |
| 2006/0080058 A1 | 4/2006 | Zimmerman et al. | |
| 2009/0168580 A1 * | 7/2009 | Kim et al. .................. | 365/225.7 |

FOREIGN PATENT DOCUMENTS

| | | |
|---|---|---|
| JP | 11-096795 | 4/1999 |
| KR | 91-001533 | 3/1991 |
| KR | 1020020040116 A | 5/2002 |

OTHER PUBLICATIONS

Notice of Prelimary Rejection issued from Korean Intellectual Property Office on Apr. 24, 2009 with an Enligh Translation.
Notice of Allowance issued from Korean Intellectual Property Office on Sep. 1, 2009 with an Enligh Translation.

* cited by examiner

*Primary Examiner* — Tuan T Nguyen
*Assistant Examiner* — Toan Le
(74) *Attorney, Agent, or Firm* — IP & T Group LLP

(57) ABSTRACT

A fuse monitoring circuit for a semiconductor memory device includes a fuse repair unit including a plurality of fuses each programmed with at least one repair address, configured to receive a fuse reset signal and to output a plurality of fuse state signals each corresponding to a connection state of one of the fuses, a fuse monitoring unit configured to receive a monitoring enable signal and to output a plurality of fuse state monitoring signals each corresponding to a corresponding one of the fuse state signals, each of the fuse state signals corresponding to one of a plurality of addresses, and an output unit configured to receive an output control signal and to output the fuse state monitoring signals to an output pad.

10 Claims, 6 Drawing Sheets

FUSE MONITORING CIRCUIT FOR SEMICONDUCTOR MEMORY DEVICE

CROSS-REFERENCE TO RELATED APPLICATION

The present invention claims priority of Korean patent application number 10-2007-0139011, filed on Dec. 27, 2007, which is incorporated by reference in its entirety.

BACKGROUND OF THE INVENTION

The present invention relates to a semiconductor design technology, and more particularly, to a technology for monitoring a fuse of a redundancy circuit in an internal circuit of a semiconductor memory device.

With advance of high integration technologies in semiconductor memory devices, the number of memory cells and signal lines for a single semiconductor memory device are rapidly increasing. Since the memory cells and the signal lines are integrated within a finite space, line widths of the internal circuit become narrower and sizes of the memory cells become smaller.

For the above reasons, failure of the memory cells in the semiconductor memory devices increases, but redundancy circuits for repairing defective memory cells of the semiconductor memory devices make it possible to produce the memory devices having expected capacity with high yield, in spite of defective cells. The redundancy cell includes fuses for programming repair addresses to redundancy memory cells and defective memory cells.

When a wafer process is completed, a variety of tests are carried out. When the memory cells determined as defective can be repaired, the defects are repaired by replacing them as redundancy memory cells. That is, the internal circuit performs a programming operation to replace an address of a defective memory cell with an address of a redundancy memory cell. Therefore, when the address of the defective memory cell is inputted, the defective memory cell is replaced with the redundancy memory cell, so that a normal operation is carried out.

A fuse programming is used to program the address information of the defective memory cell. A typical method is a laser blowing-type method, a so-called physical fuse type method, which blows a fuse by using a laser beam. However, the physical fuse type method using laser beam can be used only at a wafer level which is a step prior to fabrication of the semiconductor memory device into a package.

Therefore, instead of the physical fuse type method using laser beam, an electrical fuse type method is used to replace the defective memory cells at the package level. A fuse which is programmable at the package level is generically called an electrical fuse. This means that the programming can be performed by electrically changing the connection state of the fuse. Such an electrical fuse may be subdivided into an anti-type fuse, which changes an open state to a short state, and a blowing-type fuse, which changes a short state to an open state. The electrical fuse has a very high effectiveness because the programming is carried out after the packaging.

However, since the electric fuse type method is carried out at the package level, it is impossible to visibly monitor the connection state of the programmed fuse, as opposed to the physical fuse type method which is carried out at the wafer level. According to the related art, the package must be removed in order to monitor the connection state of the fuse programmed by the electrical method. However, the removal of the completed package in order for the test will lower the value of the completed product and reduce the efficiency of the test.

SUMMARY OF THE INVENTION

Embodiments of the present invention are directed to a fuse monitoring circuit which is capable of monitoring the connection state of a programmed fuse at the outside of a semiconductor memory device.

In accordance with an aspect of the present invention, there is provided a fuse monitoring circuit for a semiconductor memory device that includes a fuse repair unit including a plurality of fuses each programmed with at least one repair addresses the fuse repair unit configured to output a plurality of fuse state signals each corresponding to a connection state of one of the fuses; a fuse monitoring unit configured to receive a monitoring enable signal and to output a plurality of fuse state monitoring signals each corresponding to a corresponding one of the fuse state signals, each of the fuse state signals corresponding to one of a plurality of addresses; and an output unit configured to receive an output control signal and to output the fuse state monitoring signals to an output pad.

In accordance with the embodiments of the present invention, the fuse monitoring circuit can monitor the connection state of the individual fuses by using the fuse state signals and output the monitoring result to thereby enable the user to monitor the fuse states at the outside of the device.

DESCRIPTION OF SPECIFIC EMBODIMENTS

Other objects and advantages of the present invention can be understood by the following description, and become apparent with reference to the embodiments of the present invention.

Figure 1:
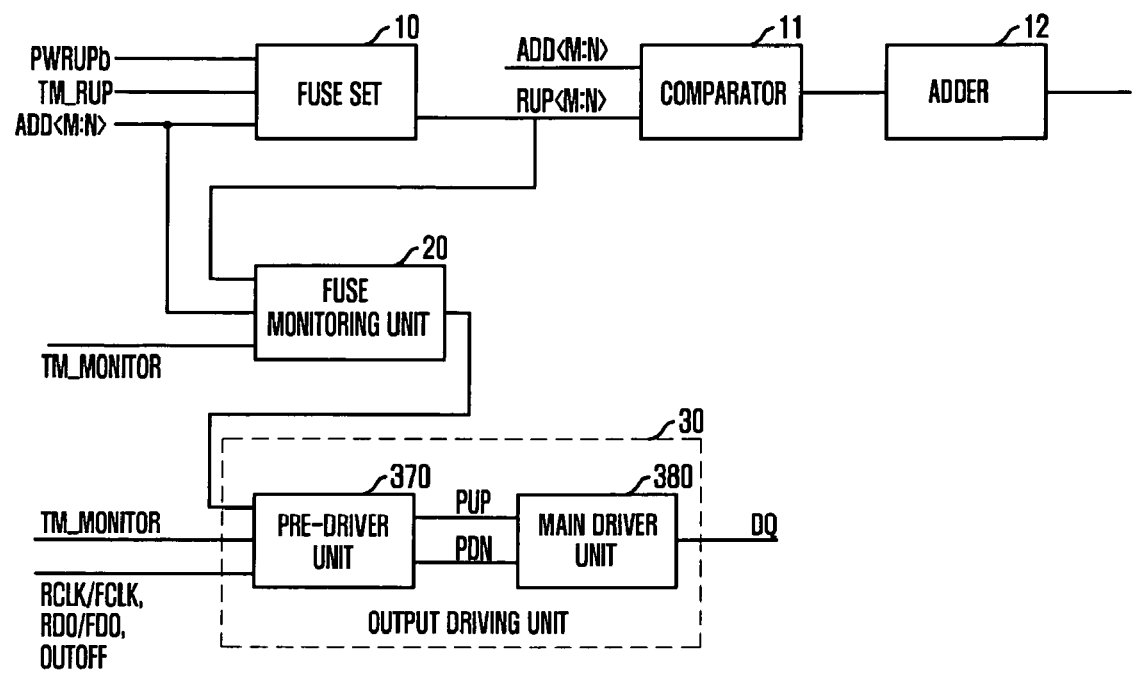
FIG. 1 is a block diagram of a fuse monitoring circuit in accordance with an embodiment of the present invention.

FIG. 1 is a block diagram of a fuse monitoring circuit in accordance with an embodiment of the present invention. Referring to FIG. 1, the fuse monitoring circuit includes a fuse set 10, a fuse monitoring unit 20, and an output driving unit 30. The fuse set 10 includes a plurality of fuses programmed with repair addresses and outputs a plurality of fuse state signals RUP<M:N> corresponding to connection states of the fuses in response to fuse reset signals PWPUPb and TM_RUP. The fuse monitoring unit 20 outputs fuse state monitoring signals corresponding to the fuse state signals selected by addresses ADD<M:N> in response to a monitoring enable signal TM_MONITOR. The output driving unit 30 outputs the fuse state monitoring signal to a data output pad DQ in response to an output control signal OUTOFF.

The fuse set 10 includes the plurality of fuses which are programmed with the repair addresses designating defective memory cells. The fuse set 10 outputs the fuse state signals RUP<M:N> representing whether the fuses used for programming the repair addresses are ruptured or not in response to the fuse reset signals TM_RUP and PWRUPb.

According to a typical redundancy circuit, a comparator 11 compares the fuse state signals RUP<M:N> with each bit of the addresses ADD<M:N>, and an adder 12 adds output signals of the comparator 11 to indicate whether to use the redundancy addressees. That is, when the addresses ADD<M:N> are inputted, the comparator 11 determines whether the inputted addresses ADD<M:N> coincide with the repair addresses programmed in the fuse set 10 by comparing them with one another. The adder 12 generates a signal which requires to replace the memory addresses according to the result of comparison.

In accordance with the embodiment of the present invention, however, the fuse monitoring unit 20 and the output driving unit 30 are further provided in the typical redundancy circuit 10, 11 and 12. In such a structure, a fuse monitoring signal MONITOR_OUT corresponding to the fuse state signal RUP<k> designated by the inputted addresses ADD<M:N> is outputted to the outside through the output pad DQ. That is, the fuse monitoring circuit in accordance with the embodiment of the present invention is designed to monitor whether the individual fuses are ruptured or not at the outside of the semiconductor memory device. For the further detailed explanation, it is assumed that an electrical type anti-fuse (hereinafter, referred to as an "anti-fuse") is used. When the anti-fuse outputs a digital value "1" when the fuse is ruptured, and outputs a digital value "0" when the fuse is not ruptured.

FIG. 2 is a circuit diagram of the fuse monitoring unit 20 of FIG. 1 in accordance with an embodiment of the present invention. Referring to FIG. 2, the fuse monitoring unit 20 includes a plurality of fuse state monitoring signal generating units 210 configured to receive the addresses ADD<M:N> in response to the monitoring enable signal TM_MONITOR and generate the plurality of fuse state monitoring signals MT_OUT<M:N> corresponding to the fuse state signals RUP<i> in response to the address bit signals ADD<i>. Also, the fuse monitoring unit 20 further includes a fuse monitoring signal generating unit 220 configured to add the fuse state monitoring signals MT_OUT<M:N> to generate the fuse monitoring signal MONITOR_OUT.

Figure 2A:
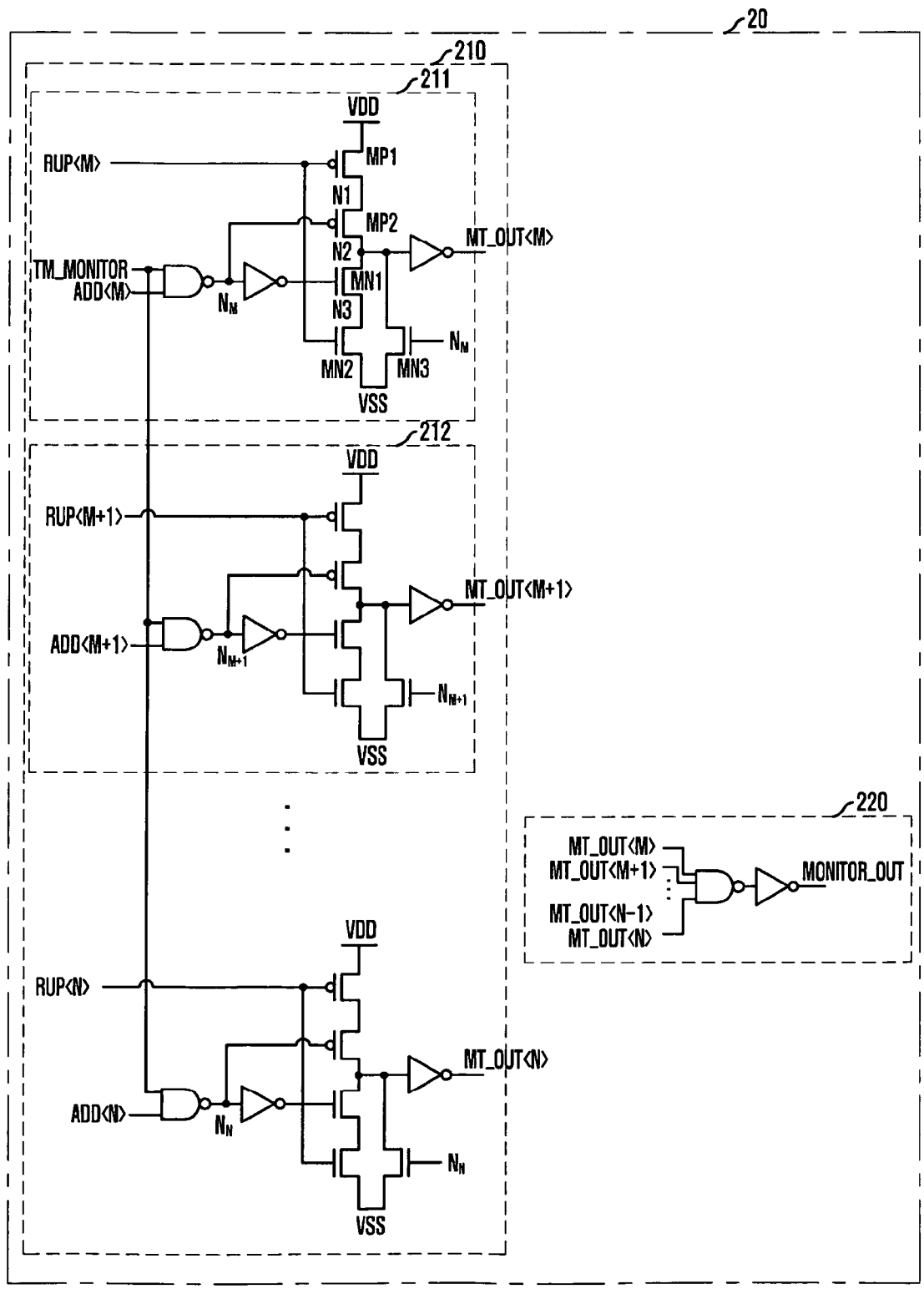
FIG. 2A is a circuit diagram of a fuse monitoring unit of FIG. 1 in accordance with an embodiment of the present invention.
Figure 2B:
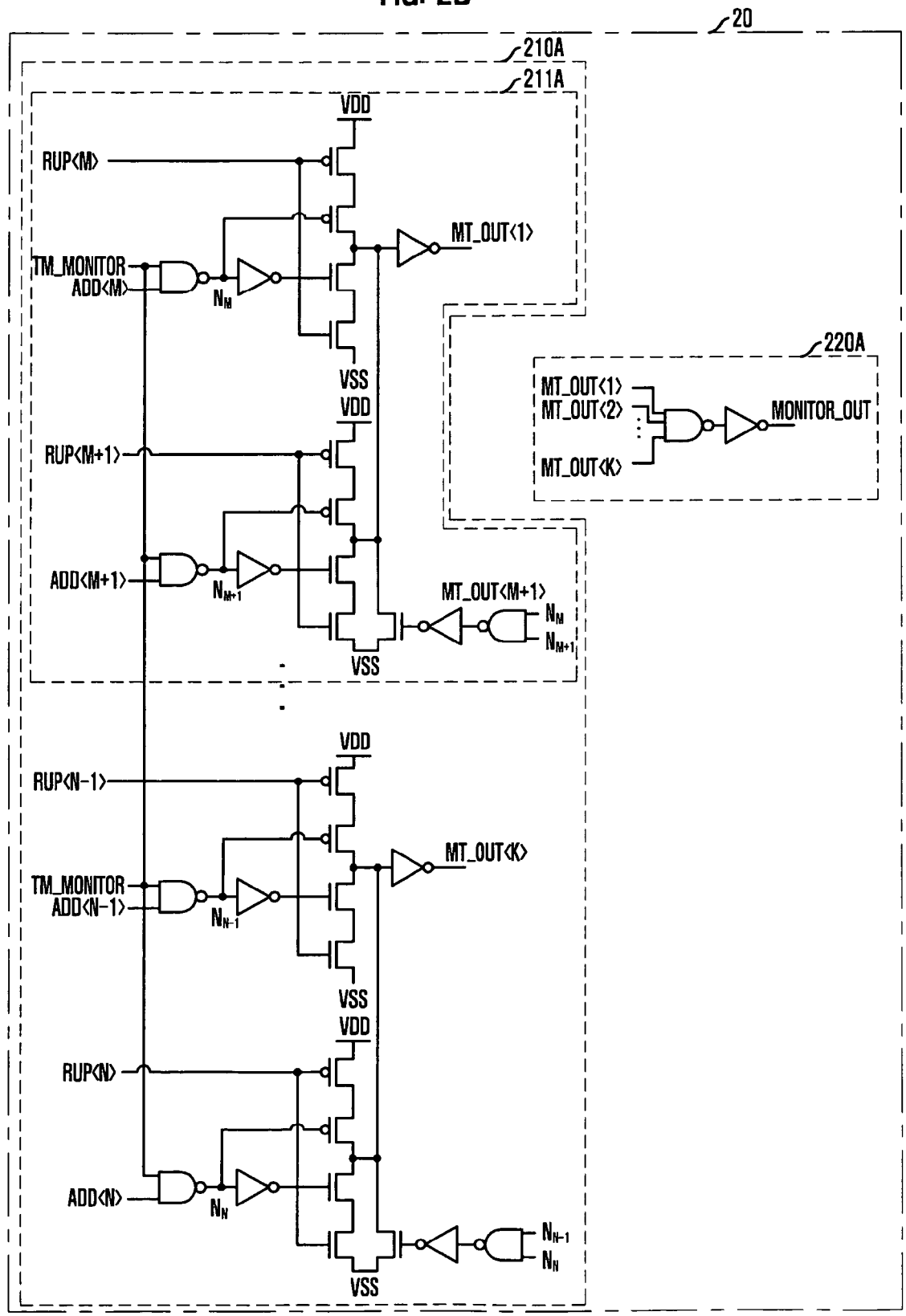
FIG. 2B is a circuit diagram of a fuse monitoring unit of FIG. 1 in accordance with another embodiment of the present invention.

FIG. 2B is a circuit diagram of the fuse monitoring unit 20 of FIG. 1 in accordance with another embodiment of the present invention. Referring to FIG. 2B, at least one or more selected among a plurality of fuse state monitoring signal generating units 210a are grouped to generate a plurality of fuse state monitoring signals MT_OUT<1:K>. In the current embodiment illustrated in FIG. 2B, the fuse state monitoring signal generating units 211, 212 . . . are grouped two by two to generate the fuse state monitoring signals. The number of the fuse state monitoring signal generating units to be grouped may be changed if necessary. Furthermore, the fuse monitoring unit 20 further includes a fuse monitoring signal generating unit 220a configured to add the fuse state monitoring signals MT_OUT<1:K> to generate the fuse monitoring signal MONITOR_OUT.

Each of the fuse monitoring signal generating units 220 and 220a includes an AND gate configured to receive the fuse state monitoring signals. In this embodiment, the AND gate is implemented with a NAND gate and an inverter.

The operation of the fuse monitoring unit 20 configured as above will be described below.

First, when the monitoring enable signal TM_MONITOR is "0", the values of all nodes $N_M, N_{M+1}, \ldots, N_N$ become "1", regardless of the inputted addresses ADD<M:N>. In this case, the fuse state monitoring signals MT_OUT<M:N> outputted from the fuse state monitoring signal generating unit 211, 212, . . . also become "1", regardless of the inputted fuse state signals RUP<M:N>. Since the fuse monitoring signal generating unit 220 outputs "1" only when all the inputted signals are "1", the fuse monitoring signal MONITOR_OUT in the above operation becomes "1". That is, the default value when the monitoring operation is not performed is outputted.

Second, when the monitoring enable signal TM_MONITOR is "1" and all the inputted addresses ADD<M:N> are "0", the values of all the nodes $N_M, N_{M+1}, \ldots, N_N$ become "1". In this case, since the fuse state monitoring signals MT_OUT<M:N> outputted from the fuse state monitoring signal generating unit 211, 212, . . . become "1", regardless of the inputted fuse state signals RUP<M:N>, the fuse monitoring signal MONITOR_OUT generated from the fuse monitoring signal generating unit 220 becomes "1". That is, the initial value when the monitoring operation starts to be performed is outputted.

Third, when the monitoring enable signal TM_MONITOR is "1" and any one address bit signal among the inputted addresses ADD<M:N> is "1", only the node to which the address bit signal of "1" is inputted becomes "0" and the other nodes become "1". The fuse state monitoring signal generating unit where the node value is "0" determines the fuse state monitoring signal MT_OUT according to the inputted fuse state signal RUP<i>. When the corresponding fuse state signal is "1", the fuse state monitoring signal becomes "1". When the fuse state signal RUP<i> is "0", the fuse state monitoring signal becomes "0". That is, the value of the fuse state signal inputted to the portion where the node value is "0" is transferred as the fuse state monitoring signal. In this case, the fuse state monitoring signals outputted from the other fuse state monitoring signal generating units where the values of the nodes become "1" become "1", regardless of the fuse state signals RUP<i>.

At this point, the fuse monitoring signal MONITOR_OUT generated from the fuse monitoring signal generating unit 220 represents the fuse state signal RUP<i> selected by the addresses ADD<M:N>, that is, whether the selected fuse is ruptured or not. That is, in the operating method of the fuse monitoring unit 20, the monitoring enable signal TM_MONITOR of "1" is applied and then the addresses ADD<M:N> of "1" are applied 1 bit by 1 bit. In this way, if the anti-fuse of the corresponding address bit is ruptured, the fuse monitoring signal MONITOR_OUT outputs "1"; and, if the anti-fuse of the corresponding address bit is not ruptured, the fuse monitoring signal MONITOR_OUT outputs "0".

FIG. 2B illustrates an example where the fuse state monitoring signal generating unit 211a generates the fuse state monitoring signal when the fuse state monitoring signal generating units 211 and 212 are grouped two by two. Since the operation of the circuit of FIG. 2B is identical to that of FIG. 2A, duplicate description will be omitted.

The output driving unit 30 outputs the generated fuse monitoring signal MONITOR_OUT to the output pad DQ.

Figure 3A:
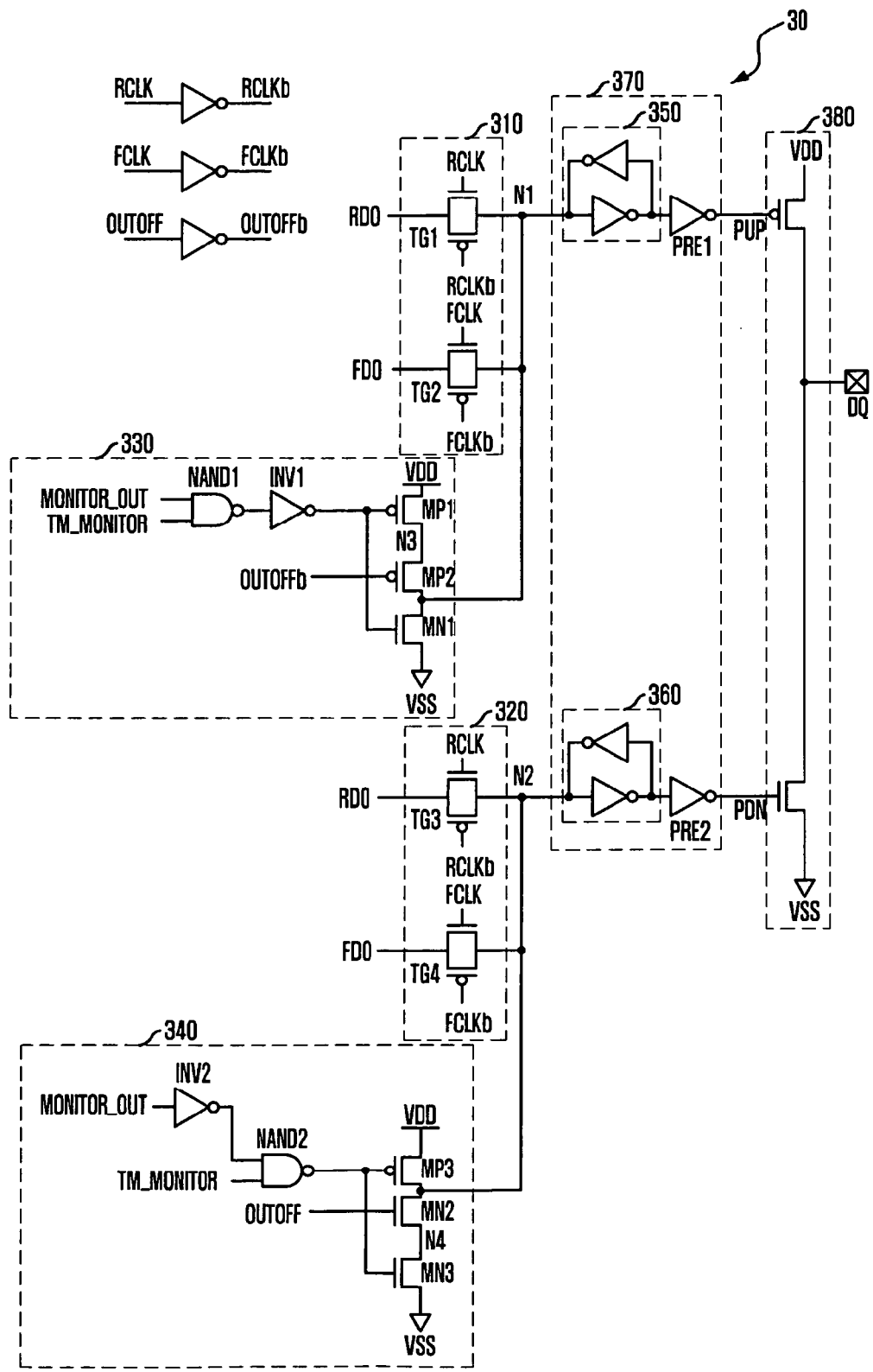
FIG. 3A is a circuit diagram of an output driving unit in accordance with an embodiment of the present invention.
Figure 3B:
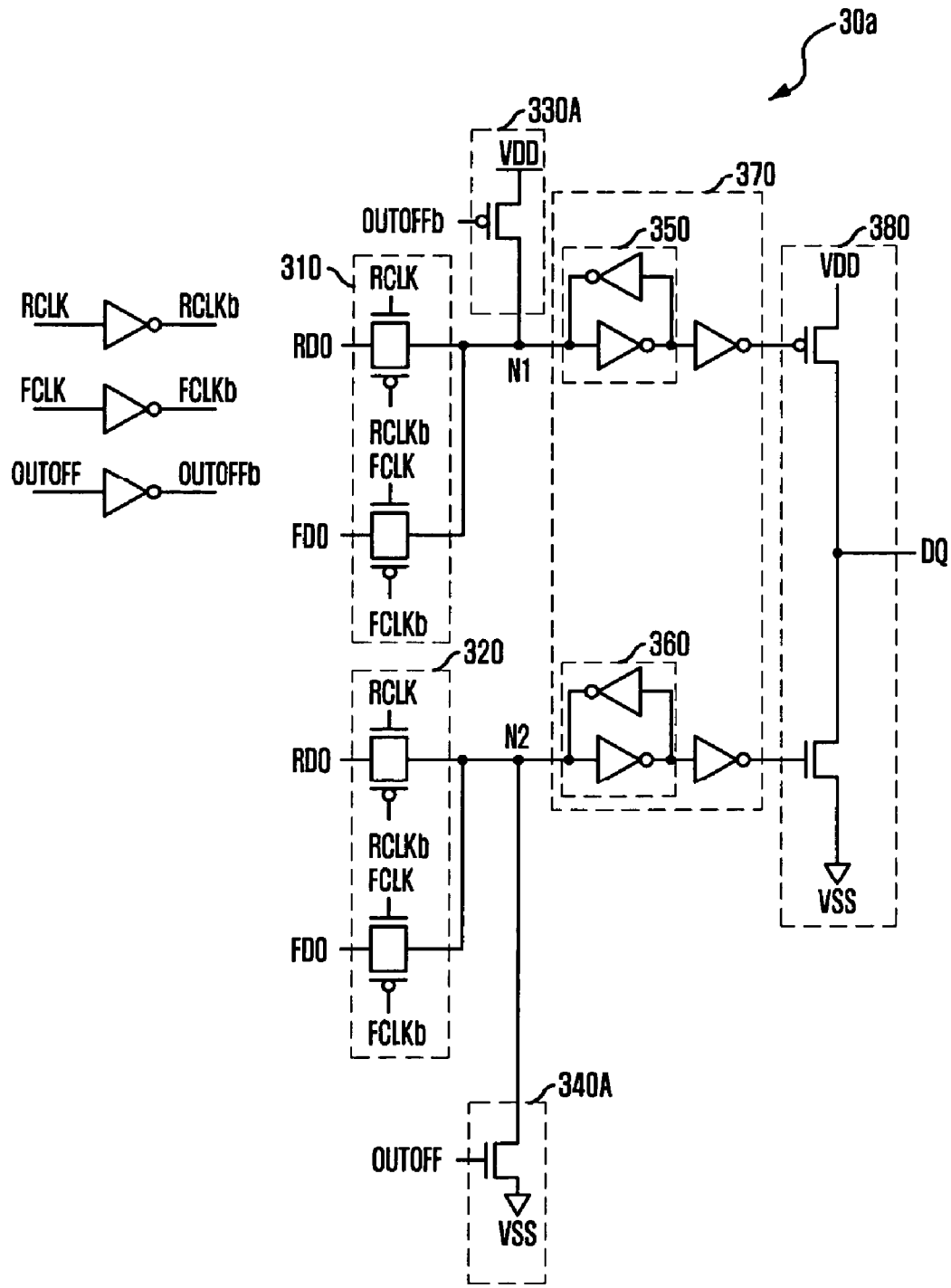
FIG. 3B is a circuit diagram of a typical output driving unit.

FIG. 3B is a circuit diagram of a typical output driving unit. The typical output driving unit 30a is controlled by an output control signal OUTOFF. When the output control signal OUTOFF is "0", the output driving unit performs a normal read operation in which output data signals RD0 and FD0 are outputted according to clock signals RCLK and FCLK. When the output control signal OUTOFF is "1", the data output pad DQ maintains high impedance (Hi-Z). That is, the data output pad DQ becomes an off state.

FIG. 3A is a circuit diagram of the output driving unit 30 in accordance with an embodiment of the present invention. The output driving unit 30 outputs the fuse monitoring signal MONITOR_OUT to the output pad. In the current embodiment, the output driving unit 30 outputs the fuse monitoring signal MONITOR_OUT through the data output pad DQ.

Referring to FIG. 3A, the output driving unit 30 includes data output units 310 and 320, output control units 330 and 340, a pre-driver unit 370, and a main driver unit 380. The data output units 310 and 320 output the output data signals RD0 and FD0 in response to the clock signals RCLK and FCLK. The output control units 330 and 340 output the fuse monitoring signal MONITOR_OUT in response to the output control signal OUTOFF and the monitoring enable signal TM_MONITOR. The pre-driver unit 370 generates a pull-up driving signal PUP and a pull-down signal PDN in response to the output signals of the data output units 310 and 320 or the output signals of the output control units 330 and 340. The main driver unit 380 drives the data output pad DQ in response to the pull-up driving signal PUP and the pull-down driving signal PDN.

The data output unit 310 includes a first transmission gate TG1 configured to output the output data signal RD0 to a first output node N1 in response to the rising clock signals RCLK and RCLKb, and a second transmission gate TG2 configured to output the output data signal FD0 to the first output node N1 in response to the falling clock signals FCLK and FCLKb. The data output unit 320 includes a third transmission gate TG3 configured to output the output data signal RD0 to a second output node N2 in response to the rising clock signals RCLK and RCLKb, and a fourth transmission gate TG4 configured to output the output data FD0 to the second output node N2 in response to the falling clock signals FCLK and FCLKb.

Furthermore, the output control unit 330 includes a first PMOS transistor MP1, a second PMOS transistor MP2, and a first NMOS transistor MN1. The first PMOS transistor MP1 has a source connected to a power supply voltage terminal VDD, a drain connected to a first node N3, and a gate receiving the fuse monitoring signal MONITOR_OUT. The second PMOS transistor MP2 has a source connected to the first node N3, a drain connected to the first output node N1, and a gate receiving the output control signal OUTOFFb. The first NMOS transistor MN1 has a source connected to a ground voltage terminal VSS, a drain connected to the first output node N1, and a gate receiving the fuse monitoring signal. The output control unit 340 includes a third PMOS transistor MP3, a second NMOS transistor NM2, and a third NMOS transistor MN3. The third PMOS transistor MP3 has a source connected to the power supply voltage terminal VDD, a drain connected to the second output node N2, and a gate receiving the fuse monitoring signal. The second NMOS transistor MN2 has a source connected to a second node N4, a drain connected to the second output node N2, and a gate receiving the output control signal OUTOFF. The third NMOS transistor MN3 has a source connected to the ground voltage terminal VSS, a drain connected to the second node N4, and a gate receiving the fuse monitoring signal.

Moreover, the pre-driver unit 370 includes a first latch 350, a second latch 360, a first pre-driver PRE1, and a second pre-driver PRE2. The first latch 350 latches the signal of the first output node N1, and the second latch 360 latches the signal of the second output node N2. The first pre-driver PRE1 inverts the signal of the first latch 350 to generate the pull-up driving signal PUP, and the second pre-driver PRE2 inverts the signal of the second latch 360 to generate the pull-down signal PDN.

The output driving unit of FIG. 3A is designed to output the fuse monitoring signal MONITOR_OUT to the data output pad DQ while maintaining the function of the typical output driving unit.

The operation of the output driving unit configured as above will be described below.

First, when the output control signal OUTOFF and the monitoring enable signal TM_MONITOR are "0" at the same time, the fuse monitoring operation is not enabled and the output driving unit performs the same operation as the normal read operation of the typical output driving unit. That is, the values of the nodes N1 and N2 are determined by the output data signals RD0 and FD0 and the main driver unit 380 outputs the values of the nodes N1 and N2 through the pre-driver unit 370 to the data output pad DQ.

Second, when the output control signal OUTOFF is "1" and the monitoring enable signal TM_MONITOR are "0", the first output node N1 and the second output node N2 become "1" and "0", respectively. In this case, the data output pad DQ is set to high impedance (Hi-Z) so that it becomes an off state.

Third, when the output control signal OUTOFF is "1" and the monitoring enable signal TM_MONITOR is "1", the fuse monitoring signal MONITOR_OUT determines the values of the output nodes N1 and N2 and outputs them through the data output pad DQ. That is, the data output pad DQ becomes "0" when the fuse monitoring signal MONITOR_OUT is "0", and the data output pad DQ becomes "1" when the fuse monitoring signal MONITOR_OUT is "1".

Figure 4:
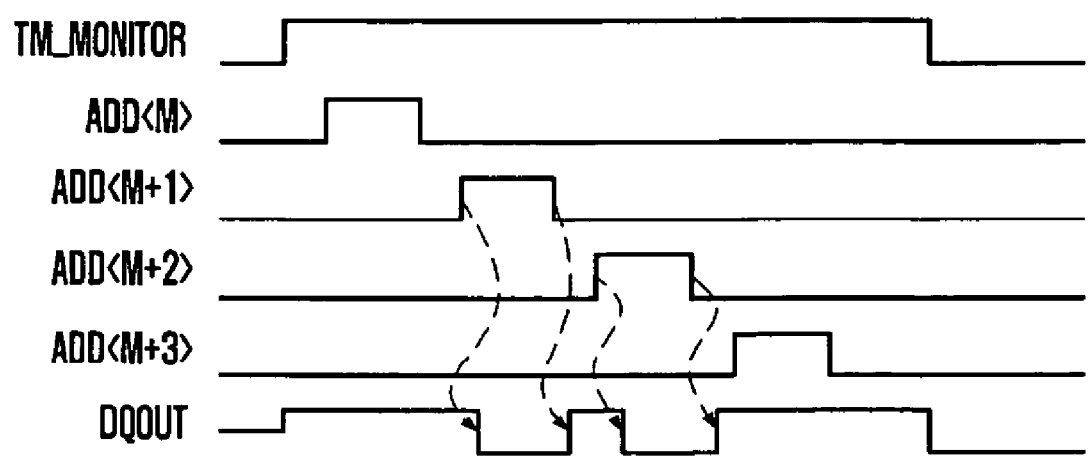
FIG. 4 is a timing diagram illustrating the operation of the fuse monitoring circuit in accordance with the embodiment of the present invention.

FIG. 4 is a timing diagram illustrating the operation of the fuse monitoring circuit in accordance with the embodiment of the present invention, when the addresses ADD are 4 bits, the fuses corresponding to the addresses ADD<M> and ADD<M+3> are ruptured, and the fuses corresponding to the addresses ADD<M+1> and ADD<M+2> are not ruptured. As shown in FIG. 4, when the monitoring enable signal TM_MONITOR is "1" and the addresses ADD of "0" are inputted, the data output pad DQOUT outputs "1" as an initial value. Thereafter, when the addresses ADD of "1" are inputted 1 bit by 1 bit, the data output pad DQOUT maintains the value of "1" if the fuse information RUP corresponding to the addresses is ruptured. On the other hand, the data output pad DQOUT outputs the value of "0" when the fuse information RUP is not ruptured. In this way, the fuse states can be monitored at the outside through the data output pad of the semiconductor memory device.

In accordance with the embodiments of the present invention, the fuse states of the redundancy device can be monitored at the outside without removing the package of the semiconductor memory device. Thus, the test can be easily performed without damaging the value of the product. Furthermore, the test cost can be reduced because the additional step of removing the package is omitted. Moreover, since the connection states of the individual fuses can be monitored at the outside of the device, a more accurate analysis can be performed through a more accurate test.

While the present invention has been described with respect to the specific embodiments, it will be apparent to those skilled in the art that various changes and modifications may be made without departing from the spirit and scope of the invention as defined in the following claims.

For example, although the fuse monitoring signal generated by adding the fuse state monitoring signals in the fuse monitoring signal generating unit of FIGS. 2A and 2B is transferred to the output driving unit, the fuse state monitoring signals outputted from the plurality of fuse state monitoring signal generating units can also be directly transferred to the output driving unit by using a plurality of output pads. The signals of the output pad may be outputted through the data output pad DQ, or may be outputted by allocating several output pads in order for the tests.

Furthermore, the fuse states can be monitored through the output pad at the outside, regardless of the fuse types such as the electrical type fuse and the laser type fuse. Such logics can be modified in various manners. It is apparent to those of ordinary skill in the art that such modifications can be easily derived, and thus its detailed description will be omitted.

What is claimed is:

1. A fuse monitoring circuit for a semiconductor memory device, comprising:
   a fuse repair unit including a plurality of fuses each programmed with at least one repair addresses, the fuse repair unit configured to receive a fuse reset signal and to output a plurality of fuse state signals each corresponding to a connection state of one of the fuses;
   a fuse monitoring unit configured to receive a monitoring enable signal and to generate a plurality of fuse state monitoring signals each corresponding to a corresponding one of the fuse state signals, each of the fuse state signals corresponding to one of a plurality of addresses; and
   an output unit configured to receive an output control signal and to output the fuse state monitoring signals to an output pad.

2. The fuse monitoring circuit of claim 1, the fuse monitoring unit including
   a plurality of fuse state monitoring signal generating units each configured to be enabled by the monitoring enable signal, to receive a corresponding one of the addresses and a corresponding one of a plurality of address bit signals, and to generate a corresponding one of the plurality of fuse state monitoring signals based on the corresponding address bit signal.

3. The fuse monitoring circuit of claim 2, wherein each of the fuse state monitoring signal generating units includes
   a first PMOS transistor having a source connected to a power supply voltage terminal, a drain connected to a first node, and a gate receiving the corresponding fuse state signal;
   a second PMOS transistor having a source connected to the first node, a drain connected to an output node, and a gate receiving the corresponding address bit signal;
   a first NMOS transistor having a drain connected to the output node, a source connected to a second node, and a gate receiving the corresponding address bit signal;
   a second NMOS transistor having a drain connected to the second node, a source connected to a ground voltage terminal, and a gate receiving the corresponding fuse state signal;
   a third NMOS transistor having a drain connected to the output node, a source connected to the ground voltage terminal, and a gate receiving the corresponding address bit signal; and
   an inverter configured to receive and invert a signal at the output node and to output the fuse state monitoring signal.

4. The fuse monitoring circuit of claim 2, wherein at least one of the plurality of fuse state monitoring signal generating units generates the plurality of fuse state monitoring signals.

5. The fuse monitoring circuit of claim 2, further comprising a fuse monitoring signal generating unit configured to add the plurality of fuse state monitoring signals and to generate a fuse monitoring signal.

6. The fuse monitoring circuit of claim 5, wherein the fuse monitoring signal generating unit comprises an AND gate configured to add the plurality of fuse state monitoring signals.

7. The fuse monitoring circuit of claim 6, the output unit including
   a data output unit configured to receive a clock signal and to output an output data signal;
   an output control unit configured to receive the output control signal and the monitoring enable signal and to output the fuse monitoring signal;
   a pre-driver unit configured to generate a pull-up driving signal corresponding to the output of the data output unit or a pull-down driving signal corresponding to the output of the output control unit; and
   a main driver unit configured to receive the pull-up driving signal and the pull-down driving signal, and to drive the output pad.

8. The fuse monitoring circuit of claim 7, the data output unit including
   a first transmission gate configured to receive a rising clock signal to output a first output data signal to a first output node;
   a second transmission gate configured to receive a falling clock signal and to output a second output data signal to the first output node;
   a third transmission gate configured to receive the rising clock signal and to output the first output data signal to a second output node; and
   a fourth transmission gate configured to receive the falling clock signal and to output the second output data signal to the second output node.

9. The fuse monitoring circuit of claim 8, the output control unit including
   a first PMOS transistor having a source connected to a power supply voltage terminal, a drain connected to a first node, and a gate receiving the corresponding fuse monitoring signal;
   a second PMOS transistor having a source connected to the first node, a drain connected to the first output node, and a gate receiving the output control signal;
   a first NMOS transistor having a source connected to a ground voltage terminal, a drain connected to the first output node, and a gate receiving the corresponding fuse monitoring signal;
   a third PMOS transistor having a source connected to the power supply voltage terminal, a drain connected to the second output node, and a gate receiving the corresponding fuse monitoring signal;
   a second NMOS transistor having a source connected to a second node, a drain connected to the second output node, and a gate receiving the output control signal; and
   a third NMOS transistor having a source connected to the ground voltage terminal, a drain connected to the second node, and a gate receiving the corresponding fuse monitoring signal.

10. The fuse monitoring circuit of claim 9, wherein the pre-driver unit comprises:
    a first latch configured to latch a first output node signal of the first output node;

a second latch configured to latch a second output node signal of the second output node;
a first pre-driver configured to invert a first latch output signal of the first latch to generate the pull-up driving signal; and
a second pre-driver configured to invert a second latch output signal of the second latch to generate the pull-down driving signal.

* * * * *